(12) United States Patent
Kono

(10) Patent No.: US 8,644,097 B2
(45) Date of Patent: Feb. 4, 2014

(54) MEMORY DEVICE

(75) Inventor: Noriaki Kono, Tama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 29 days.

(21) Appl. No.: 13/485,529

(22) Filed: May 31, 2012

(65) Prior Publication Data
US 2013/0028035 A1 Jan. 31, 2013

(30) Foreign Application Priority Data
Jul. 27, 2011 (JP) ................................. 2011-164739

(51) Int. Cl.
*G11C 7/00* (2006.01)
*G11C 29/00* (2006.01)

(52) U.S. Cl.
USPC ...................................... 365/200; 365/230.06

(58) Field of Classification Search
USPC ............................................ 365/200, 230.06
See application file for complete search history.

(56) References Cited

U.S. PATENT DOCUMENTS

| | | | |
|---|---|---|---|
| 6,373,775 B2 | 4/2002 | Ishikawa | |
| 6,512,709 B1 * | 1/2003 | Nakahara et al. | ............. 365/200 |
| 6,804,156 B2 | 10/2004 | Ito | |
| 6,999,360 B2 * | 2/2006 | Komura | ......................... 365/200 |
| 7,009,895 B2 * | 3/2006 | Bunce et al. | .................. 365/200 |
| 7,460,421 B2 | 12/2008 | Kohara | |
| 7,499,351 B2 | 3/2009 | Iwai | |

FOREIGN PATENT DOCUMENTS

| | | |
|---|---|---|
| JP | 2001-256794 A | 9/2001 |
| JP | 2004-133970 A | 4/2004 |
| JP | 2007-193879 A | 8/2007 |
| JP | 2007-311007 A | 11/2007 |

* cited by examiner

*Primary Examiner* — Harry W Byrne
*Assistant Examiner* — Lance Reidlinger
(74) *Attorney, Agent, or Firm* — Arent Fox LLP

(57) ABSTRACT

A memory device has: a plurality of memory cell blocks, the memory cell block including a plurality of memory cells, a redundancy memory cell, and a selector switching a defective memory cell among the plurality of memory cells to the redundancy memory cell; and a control circuit outputting control signals of the selectors of the plurality of memory cell blocks, based on defect information indicating whether or not each of the plurality of memory cell blocks has a defective memory cell and on specification information for specifying the defective memory cell in the memory cell block having the defective memory cell, wherein the control circuit has: a plurality of flip-flops provided in correspondence with respective bit lines of the control signals of the selectors of the plurality of memory cell blocks and for shifting the specification information serially.

4 Claims, 11 Drawing Sheets

F I G. 1
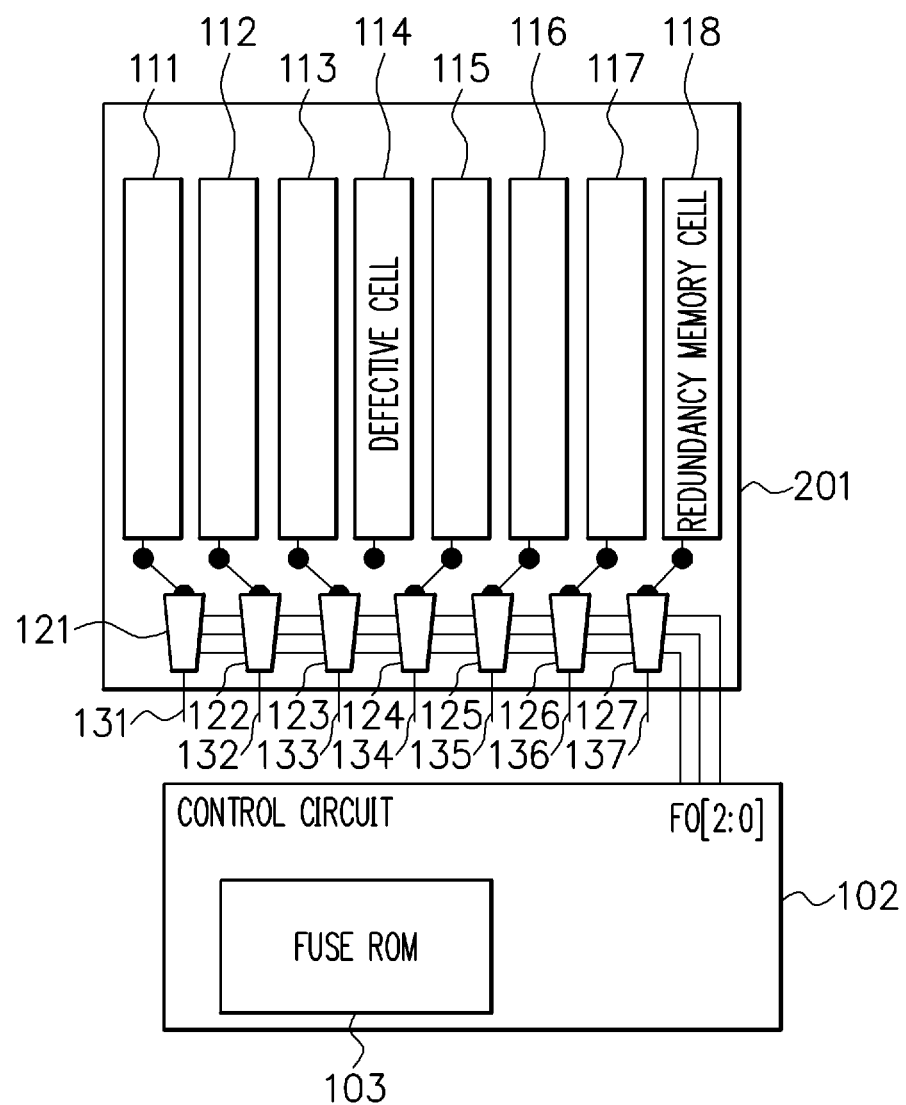

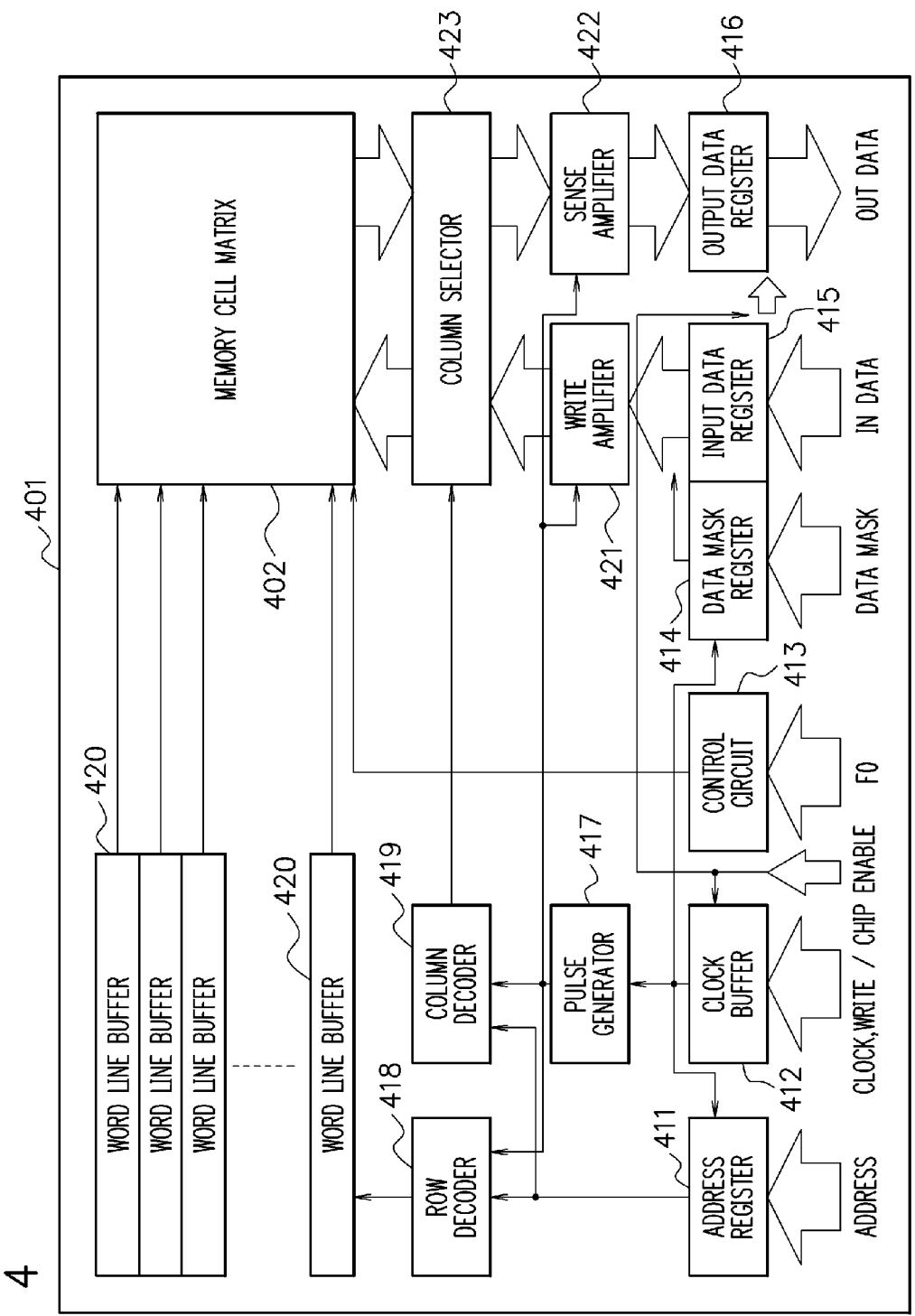
F I G. 4

F I G. 7
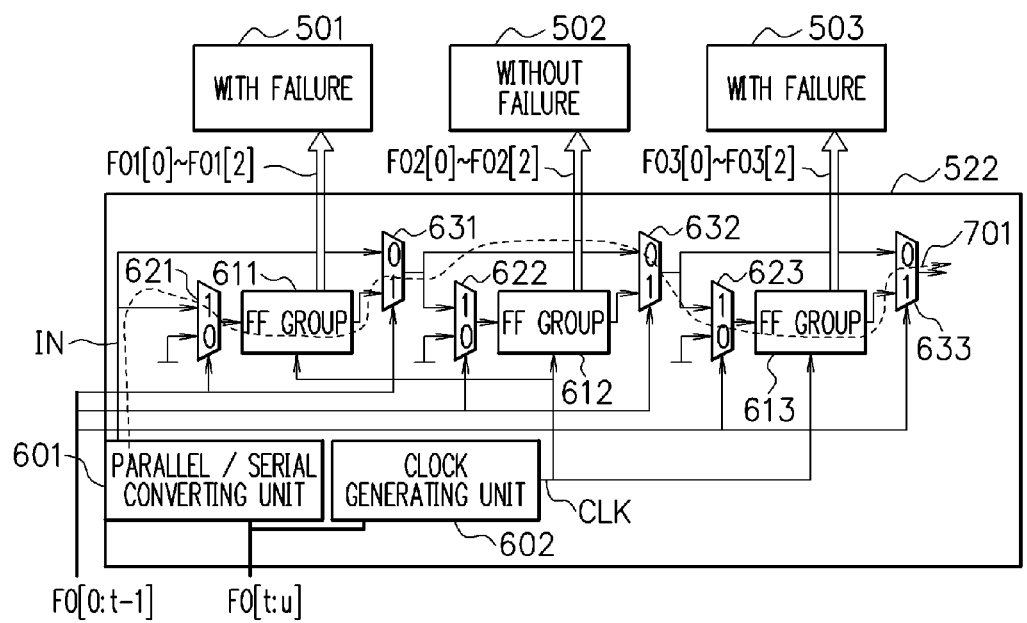

F I G. 11
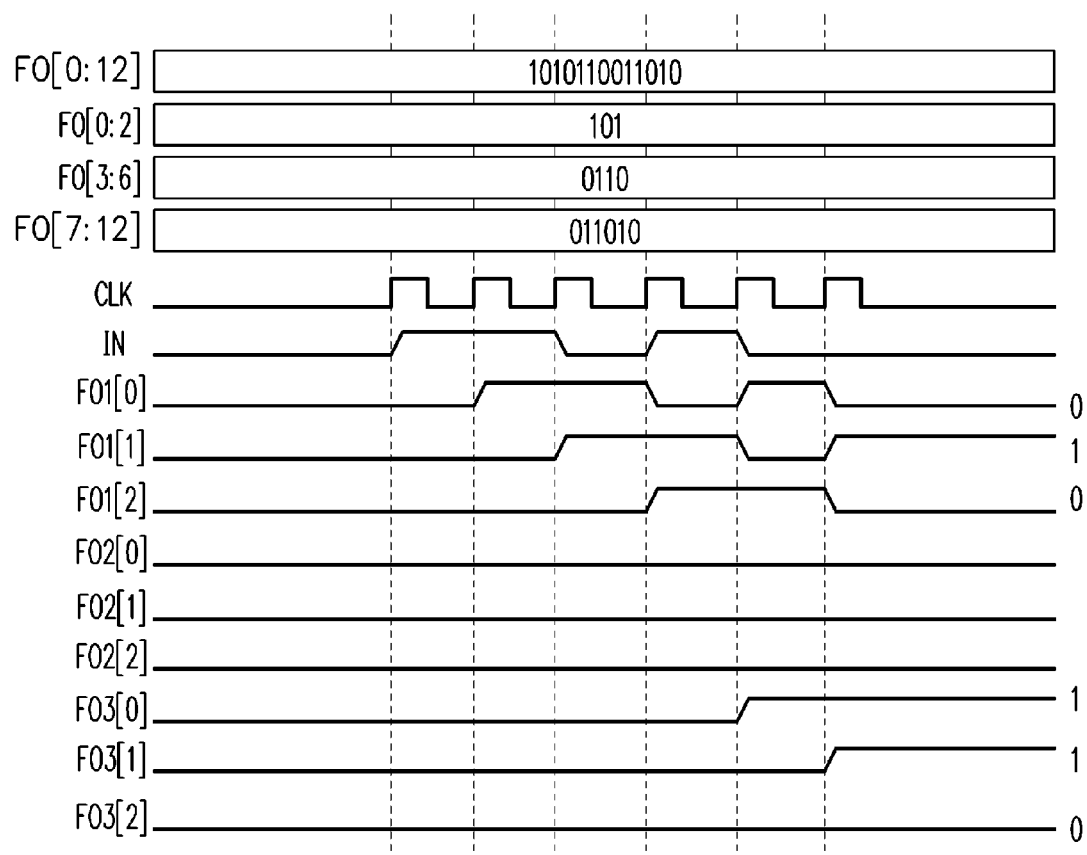

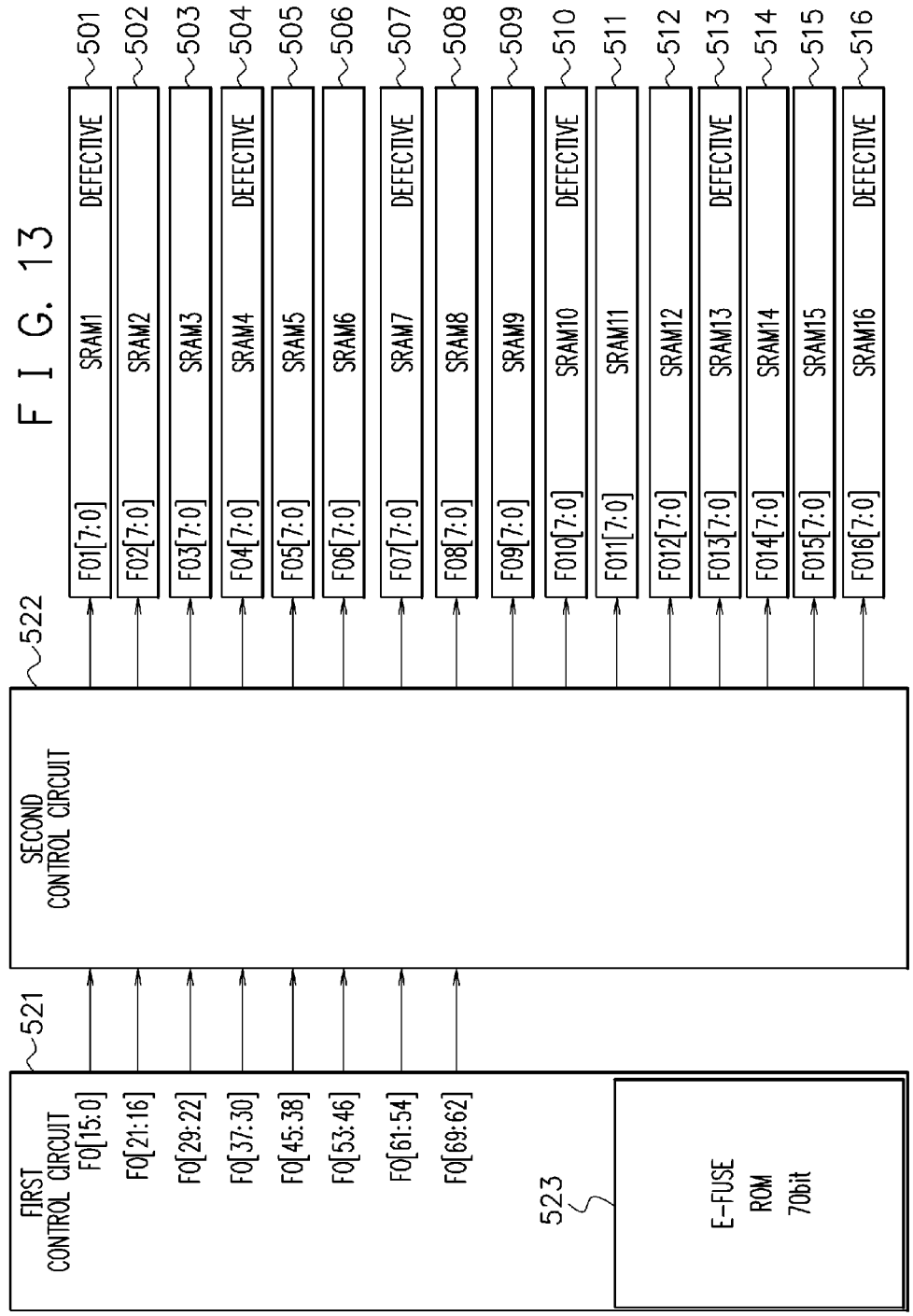

MEMORY DEVICE

CROSS-REFERENCE TO RELATED APPLICATION

This application is based upon and claims the benefit of priority of the prior Japanese Patent Application No. 2011-164739, filed on Jul. 27, 2011, the entire contents of which are incorporated herein by reference.

FIELD

The embodiment discussed herein is directed to a memory device.

BACKGROUND

It is inevitable to mount a memory device in fabricating a semiconductor device. A yield of the memory device affects a yield of the semiconductor device. The yield of the memory device cannot be ignored, in particular, in a semiconductor device to which a mass storage memory device is mounted and a semiconductor device to which a large quantity of memory devices is mounted.

In a memory device mounted to a semiconductor device, a redundancy memory cell is prepared in advance and a defective memory cell is switched to the redundancy memory cell, whereby a yield is improved. In order to switch the defective memory cell, it is necessary to give a memory device information for switching the defective memory cell to the redundancy memory cell. Thus, a fuse ROM is mounted to a semiconductor device in advance and a fuse of the fuse ROM is cut off as information of a position of the defective memory cell. A selector switches the defective memory cell to the redundancy memory cell in correspondence with a signal from the fuse ROM, reducing a defect ratio, so that improvement of the yield becomes possible.

Further, there is known a semiconductor integrated circuit device that has: a plurality of memory macros which an address is each allotted to, data of a defect address of a semiconductor memory is each transmitted to, stores the data of defect address, and can perform replacement with a redundancy cell; a plurality of nonvolatile storage elements which are provided by the number smaller than a number of the plurality of memory macros and store redundancy data to be transferred to the plurality of memory macros and address data indicating transfer destinations of the redundancy data in pair; and a transfer control circuit performing transfer of the redundancy data from the plurality of nonvolatile storage elements to the corresponding memory macros in accordance with the transfer destination address data (for example, see Patent Literature 1).

Further, there is known a semiconductor memory device that has: a memory cell array which includes a regular memory array part and a spare array part provided adjacently to the regular memory array part in order to replace a defective portion in the regular memory array; and a plurality of internal data lines for transmitting data to be inputted/outputted to/from the memory cell array part (for example, see Patent Literature 2).

Further, there is known a semiconductor integrated circuit device that has: a memory cell array in which a plurality of memory cells are disposed in an array; a redundancy circuit having a plurality of spare memory cells and replacing a defective memory cell in the memory cell array with the specific spare memory cell based on programmed address information; a storage circuit for programming address information and having a plurality of nonvolatile storage elements; and transferring circuit transferring the address information programmed in the storage circuit to the redundancy circuit (for example, see Patent Literature 3).

Further, there is known a semiconductor storage device that has: a clock generating circuit which includes a memory macro and a fuse box in which fuse data to be transferred to the memory macro is stored in a nonvolatile storage element, the fuse box generating a data transfer clock; a plurality of first fuse data latch circuits latching fuse data and transferring the fuse data serially on receiving a transfer clock; and a clock counter counting the transfer clock and generating a count up signal by a predetermined number of counts (for example, see Patent Literature 4).

[Patent Literature 1] Japanese Laid-open Patent Publication No. 2007-193879

[Patent Literature 2] Japanese Laid-open Patent Publication No. 2001-256794

[Patent Literature 3] Japanese Laid-open Patent Publication No. 2004-133970

[Patent Literature 4] Japanese Laid-open patent Publication No. 2007-311007

SUMMARY

A memory device has: a plurality of memory cell blocks, the memory cell block including a plurality of memory cells, a redundancy memory cell, and a selector switching a defective memory cell among the plurality of memory cells to the redundancy memory cell; and a control circuit outputting control signals of the selectors of the plurality of memory cell blocks, based on defect information of whether or not each of the plurality of memory cell blocks has a defective memory cell and on specification information for specifying the defective memory cell in the memory cell block having the defective memory cell, wherein the control circuit has: a plurality of flip-flops provided in correspondence with respective bit lines of the control signals of the selectors of the plurality of memory cell blocks and for shifting the specification information serially; a bypath circuit bypathing the flip-flop corresponding to the memory cell block which corresponds to the defect information if the defect information is information of not having the defective memory cell, and shifting the specification information serially in relation to the flip-flop corresponding to the memory cell block which corresponds to the defect information if the defect information is information of having the defective memory cell; a reset circuit making the flip-flop corresponding to the memory cell block which corresponds to the defect information store the control signal indicating nonexistence of the defective memory cell, if the defect information is information of not having the defective memory cell; and a clock generating unit outputting a clock signal to make the plurality of flip-flops shift the specification information to the plurality of flip-flops, wherein the plurality of flip-flops, after being synchronized with the clock signal and shifting the specification information, outputs the control signals of the selectors of the plurality of memory cell blocks, and wherein the selector of the memory cell block switches the defective memory cell to the redundancy memory cell in correspondence with the control signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a diagram depicting a configuration example of a memory device;

FIG. 4 is a diagram depicting an inside configuration example of a memory cell block according to the embodiment;

FIG. 7 is a diagram depicting an operation example of the second control circuit of FIG. 6;

FIG. 11 is a timing chart indicating an operation example of the memory device of FIG. 10 when the information of FIG. 9 is inputted;

FIG. 13 is a diagram explaining a storage capacity of a fuse ROM necessary for the memory device of FIG. 5 of the present embodiment.

DESCRIPTION OF EMBODIMENTS

Reference Technique

Figure 2:
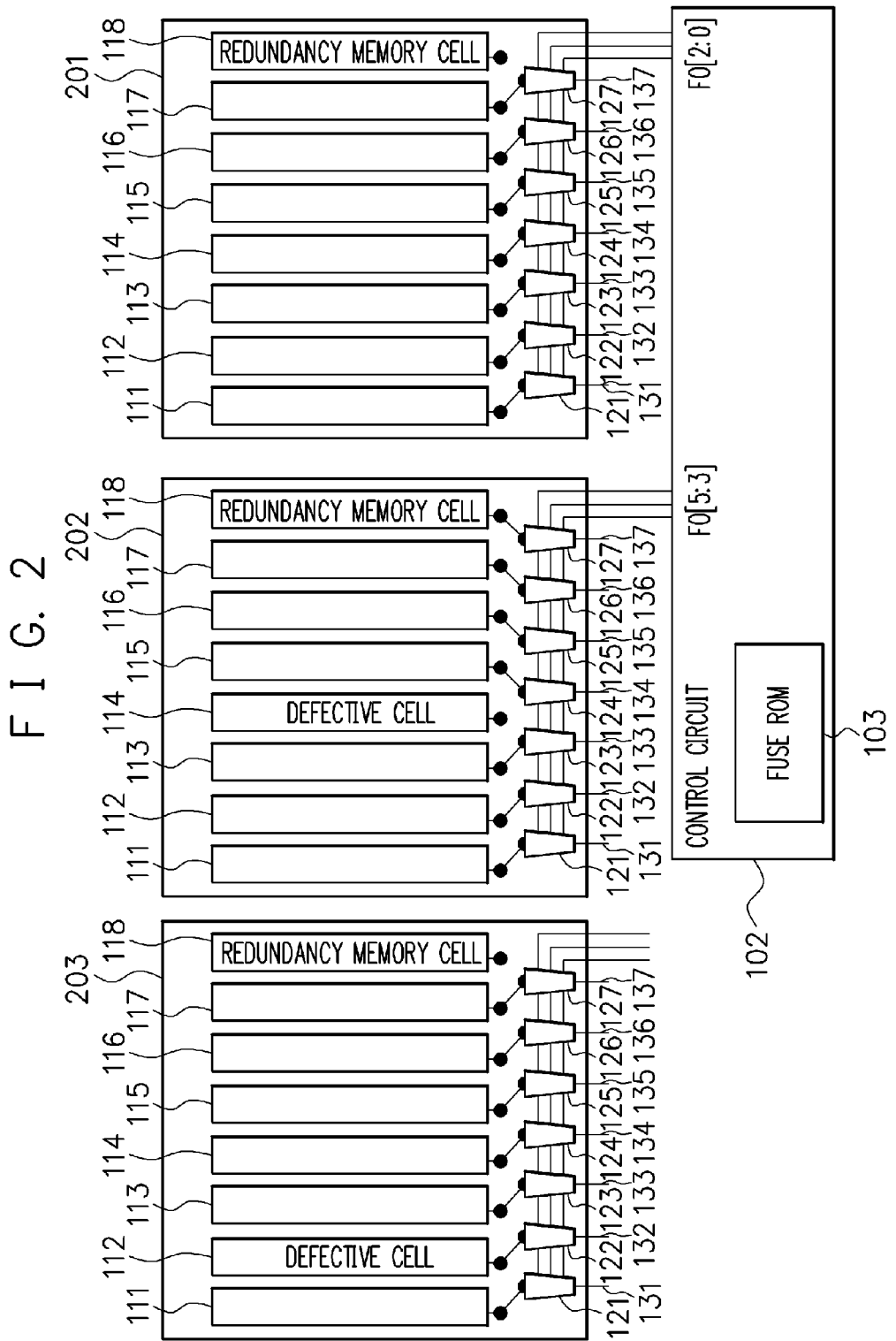
FIG. 2 is a diagram depicting a configuration example of a memory device having a plurality of memory cell blocks.

FIG. 1 is a diagram depicting a configuration example of a memory device. The memory device has a memory cell block 201 and a control circuit 102. The memory cell block 201 has a plurality of memory cells 111 to 117, a redundancy memory cell 118, and a plurality of selectors 121 to 127. The memory cells 111 to 118 are, for example, SRAM memory cells. If a defective memory cell 114 exists among the plural memory cells 111 to 117, the selectors 121 to 127 can switch the defective memory cell 114 to the redundancy memory cell 118. The control circuit 102 has a fuse ROM 103. The fuse ROM 103 stores 3-bit specification information F0 [2:0] for specifying a position of a defective memory cell (for example, the defective memory cell 114) among the memory cells 111 to 117, and outputs the specification information F0 [2:0] to the selectors 121 to 127 in the memory cell block 201. If the defective memory cell exists among the memory cells 111 to 117, the specification information F0 [2:0] indicates information for specifying a position of one defective memory cell among the memory cells 111 to 117, and if a defective memory cell does not exist among the memory cells 111 to 117, the specification information F0 [2:0] indicates information telling to that effect. The selectors 121 to 127 connect, excluding the defective memory cell 114 indicated by the specification information F0 [2:0], the other memory cells 111 to 113, 115 to 118 to external lines 131 to 137 and the like. For example, the selectors 121 to 123 connect the memory cells 111 to 113 to the external lines 131 to 133, while the selectors 124 to 127 connect the memory cells 115 to 118 to the external lines 134 to 137. When the specification information F0 [2:0] indicates information telling nonexistence of a defective memory cell, the selectors 121 to 127 connect the memory cells 111 to 117 to the external lines 131 to 137, respectively. The external lines 131 to 137 are bit lines and/or word lines. Thereby, it is possible to switch the defective memory cell 114 to the redundancy memory cell 118, which is then used.

FIG. 2 is a diagram depicting a configuration example of a memory device having a plurality of memory cell blocks 201 to 203. The memory device has the memory cell blocks 201 to 203 and a control circuit 102. The memory cell blocks 202 and 203 have configurations similar to that of the memory cell block 201. A fuse ROM 103 stores, in order for memory capacity reduction, 3-bit specification information F0 [2:0] and 3-bit specification information F0 [5:3] for specifying positions of defective memory cells in the two memory cell blocks among the memory cell blocks 201 to 203. For example, the memory cell block 201 does not have a defective memory cell, the memory cell block 202 has a defective memory cell 114, and the memory cell block 203 has a defective memory cell 112. The control circuit 102 outputs the specification information F0 [2:0] to selectors 121 to 127 in the memory cell block 201, and outputs the specification information F0 [5:3] to selectors 121 to 127 in the memory cell block 202. In the memory cell block 201, the selectors 121 to 127 connect, excluding a redundancy memory cell 118, memory cells 111 to 117 to external lines 131 to 137 respectively, based on the specification information F0 [2:0] telling nonexistence of a defective memory cell. In the memory cell block 202, the selectors 121 to 127 connect, excluding the defective memory cell 114, memory cells 111 to 113, 115 to 118 to external lines 131 to 137 respectively, based on the specification information F0 [5:3] specifying a position of the defective memory cell 114. In the memory cell block 203, control of selectors 121 to 127 is not performed, and memory cells 111 to 117 are connected to external lines 131 to 137 respectively as a default state, the defective memory cell 112 being connected to the external line 132. Thus, rescue of the defective memory cell 112 cannot be performed. In such a case, since the specification information F0 [2:0] and F0 [5:3] only have bit numbers for rescuing the two memory cell blocks 201 and 202, rescue is not possible if the memory cell block 203 has the defective memory cell 112.

Figure 3:
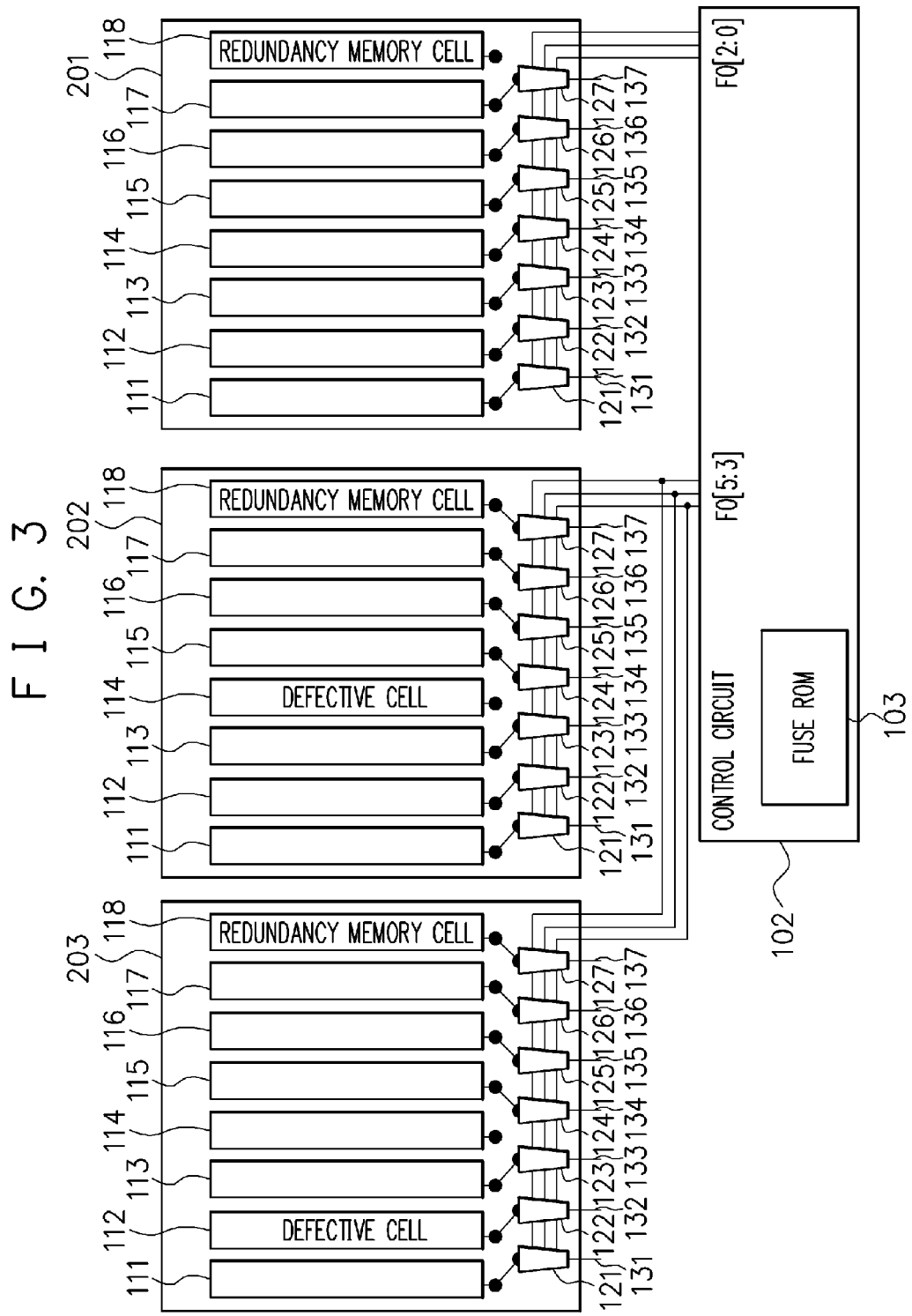
FIG. 3 is a diagram depicting another configuration example of a memory device having a plurality of memory cell blocks.

FIG. 3 is a diagram depicting another configuration example of a memory device having a plurality of memory cell blocks 201 to 203. The memory device of FIG. 3 is different from the memory device of FIG. 2 in that selectors 121 to 127 in the memory cell block 203 is also controlled by specification information F0 [5:3]. In the memory cell block 203, similarly to in the memory cell block 202, a memory cell 114 is cut off and a memory cell 112 is connected to an external line 132. In such a case, a defective memory cell 112 becomes in a used state and rescue of the defective memory cell 112 cannot be performed. Since the memory cell blocks 202 and 203 use the specification information F0 [5:3] in common, the number of the memory cell blocks 201 to 203 to be able to be rescued increases. However, in a case that the memory cell blocks 202 and 203 which use the specification information F0 [5:3] in common both have defective memory cells, either one of the memory cell blocs 202 and 203 can be rescued but the other one cannot be rescued.

Embodiment

FIG. 4 is a diagram depicting an inside configuration example of a memory cell block according to an embodiment. An address register 411 holds an inputted address. A clock buffer 412 amplifies an inputted clock signal. A write/chip enable signal is inputted to the clock buffer 412 and the like. A pulse generator 417 generates a pulse signal based on a clock signal outputted by the clock buffer 412 and outputs to a row decoder 418, a column decoder 419, a write amplifier 421, and a sense amplifier 422. The row decoder 418 decodes the address in the address register 411 and outputs to a word line buffer 420. The word line buffer 420 selects a word line of two-dimensional matrix memory cells arranged in a memory cell matrix 402. The column decoder 419 decodes the address in the address register 411 and controls a column selector 423 in correspondence with the column address.

First, a write operation will be described. A data mask is held in a data mask register 414. Input data is held in an input data register 415. The write amplifier 421 amplifies the input data in the input data register 415. The column selector 423 selects a bit line of a memory cell in the memory cell matrix 402 in correspondence with the column address, and outputs output data of the write amplifier 421 to the selected bit line. The data of the bit line is written in the memory cell whose word line is selected.

Next, a read operation will be described. In the memory cell matrix 402, the memory cell whose word line is selected outputs the held data to the bit line. The column selector 423 selects a bit line in correspondence with the column address and outputs data of the selected bit line to the sense amplifier 422. The sense amplifier amplifies inputted data. The output data register 416 holds output data of the sense amplifier 422 and outputs the data to the outside.

A control circuit 413 inputs and holds information FO, and switches a defective memory cell in the memory cell matrix 402 to a redundancy memory cell.

Figure 5:
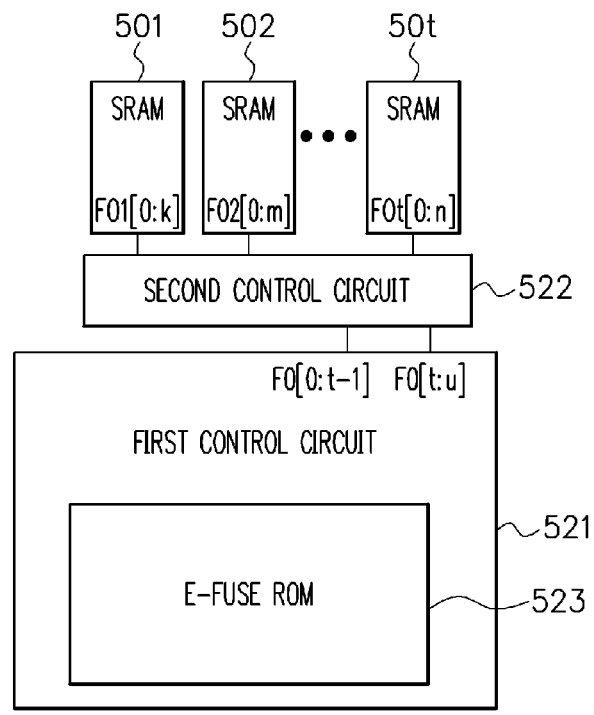
FIG. 5 is a diagram depicting an entire configuration example of a memory device according to the embodiment.

FIG. 5 is a diagram depicting an entire configuration example of a memory device according to the embodiment. Memory cell blocks 501 to 50t of as many as t each have a configuration similar to that of the memory cell block 201 of FIG. 1. The memory cell block 201 of FIG. 1 is the same as the inside configuration example of the memory cell block of FIG. 4. The first control circuit 521 has an electrical fuse ROM (nonvolatile memory) 523 which performs writing by electrically cutting off the fuse. It should be noted that the fuse ROM 523 can be an optical fuse ROM performing writing by optically cutting off the fuse by a laser beam, other than the electrical fuse ROM. The fuse ROM 523 stores defect information F0 [0:t−1] and specification information F0 [t:u]. The defect information F0 [0:t−1] is information indicating whether or not each of the plural memory cell blocks 501 to 50t has a defective memory cell. The specification information F0 [t:u] is information for specifying a defective memory cell in a memory cell block having the defective memory cell. The first control circuit 521 outputs the defect information F0 [0:t−1] and the specification information F0 [t:u] in the fuse ROM 523 to the second control circuit 522. The second control circuit 522 inputs the defect information F0 [0:t−1] and the specification information F0 [t:u], and outputs the specification information to the memory cell blocks 501 to 50t. The memory cell blocks 501 to 50t switch a defective memory cell to a redundancy memory cell in correspondence with the specification information. If the memory cell blocks 501 to 501t of as many as t exist, defect information F0 [0:t−1] of t-bit is used as a select signal.

Figure 6:
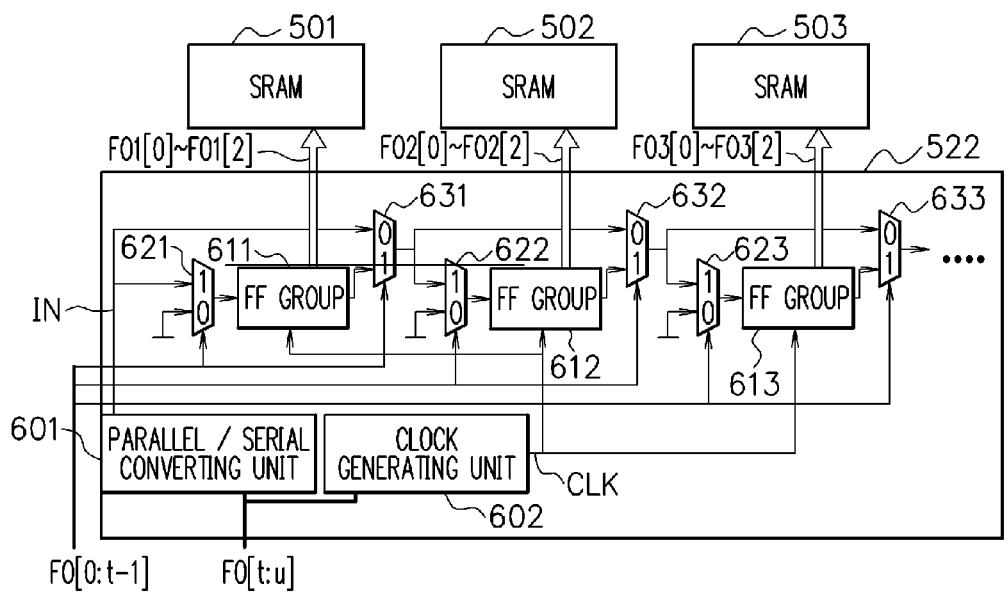
FIG. 6 is a diagram depicting a configuration example of a second control circuit.

FIG. 6 is a diagram depicting a configuration example of a second control circuit 522. Information F0 [t:u] has information of a clock pulse number and information for specifying a position of a defective memory cell only with regard to the memory cell block having the defective memory cell among the memory cell blocks 501 to 50t. A clock generating unit 602 generates a clock signal CLK having a clock pulse number designated by the information F0 [t:u]. A parallel/serial converting unit 601 converts specification information in the information F0 [t:u] from parallel to serial and outputs serial specification information IN.

First defect information F0 [0] is "1" if the first memory cell block 501 has a defective memory cell, and is "0" if the first memory cell block 501 does not have a defective memory cell. Second defect information F0 [1] is "1" if the second memory cell block 502 has a defective memory cell, and is "0" if the second memory cell block 502 does not have a defective memory cell. Third defect information F0 [2] is "1" if the third memory cell block 503 has a defective memory cell, and is "0" if the third memory cell block 503 does not have a defective memory cell.

A selector 621 selects specification information IN if the first defect information F0 [0] is "1" and selects data "0" if the first defect information F0 [0] is "0", and outputs to a flip-flop group 611. The flip-flop group 611 is a shift register which has a series connection circuit of three flip-flops and shifts input data by a pulse number of a clock signal CLK, for example.

A selector 631 selects output data of the flip-flop group 611 when the first defect information F0 [0] is "1" and selects the specification information IN when the first defect information F0 [0] is "0", and outputs.

A selector 622 selects output data of the selector 631 when the second defect information f0 [1] is "1" and selects data "0" when the second defect information F0 [1] is "0", and outputs to a flip-flop group 612. The flip-flop group 612 is a shift register which has a series connection circuit of three flip-flops and shifts input data by a pulse number of a clock signal CLK, for example.

A selector 632 selects output data of the flip-flop group 612 when the second defect information F0 [1] is "1" and selects output data of the selector 631 when the second defect information F0 [1] is "0", and outputs.

A selector 623 selects output data of the selector 632 when third defect information F0 [2] is "1" and selects data "0" when the third defect information F0 [2] is "0", and outputs to a flip-flop group 613. The flip-flop group 613 is a shift register which has a series connection circuit of three flip-flops and shifts input data by a pulse number of a clock signal CLK, for example.

A selector 633 selects output data of the flip-flop group 613 when the third defect information F0 [2] is "1" and selects output data of the selector 632 when the third defect information F0 [2] is "0", and outputs.

By the selectors 621 to 623 and 631 to 633, only the flip-flop groups 611 to 613 corresponding to the memory cell blocks 501 to 503 having defective memory cells are connected in a chain form. By inputting the serial specification information to the chain of the flip-flop groups 611 to 613 and shifting by the pulse number of the clock signal CLK, the specification information IN is set only in the flip-flop groups 611 to 613 corresponding to the memory cell blocks 501 to 503 having the defective memory cells. The flip-flop groups 611 to 613 corresponding to the memory cell block not having a defective memory cell are bypathed by the selectors 621 to 623 and 631 to 633, and the data "0" is set.

After data shift of the flip-flop groups 611 to 613, the flip-flop group 611 outputs 3-bit specification information FO1 [0] to FO1 [2] for specifying a position of the defective memory cell to the memory cell block 501. The memory cell block 501 switches the defective memory cell to a redundancy memory cell in correspondence with the specification information FO1 [0] to FO1 [2]. The flip-flop group 612 outputs 3-bit specification information FO2 [0] to FO2 [2] for specifying a position of the defective memory cell to the memory cell block 502. The memory cell block 502 switches the defective memory cell to a redundancy memory cell in correspondence with the specification information FO2 [0] to FO2 [2]. The flip-flop group 613 outputs 3-bit specification information FO3 [0] to FO3 [2] for specifying a position of the defective memory cell to the memory cell block 503. The memory cell block 503 switches the defective memory cell to a redundancy memory cell in correspondence with the specification information FO3 [0] to FO3 [2].

FIG. 7 is a diagram depicting an operation example of the second control circuit 522 of FIG. 6. Explanation will be done in an example of a case that the memory cell blocks 501 and 503 are memory cell blocks with failure which have defective memory cells and the memory cell block 502 is a memory cell block without failure which does not have a defective memory cell. In such a case, the specification information IN is transmitted by a path 701.

Since the first memory cell block 501 has the defective memory cell, the first defect information F0 [0] becomes "1". Then, the selector 621 selects the specification information IN, and the selector 631 selects the output data of the flip-flop group 611.

Since the second memory cell block 502 does not have a defective memory cell, the second defect information F0 [1] becomes "0". Then, the selector 622 selects the data "0" and the selector 632 selects the output data of the selector 631.

Since the third memory cell block 503 has the defective memory cell, the third defect information F0 [2] becomes "1". Then, the selector 623 selects the output data of the selector 632, and the selector 633 selects the output data of the flip-flop group 613.

Thereby, in the flip-flop group 611, the 3-bit specification information FO1 [0] to FO1 [2] being part of the specification information IN is set. In the memory cell block 501, the defective cell is switched to the redundancy memory cell in correspondence with the specification information FO1 [0] to FO1 [2].

In the flip-flop group 612, "000" is set as the 3-bit specification information FO2 [0] to FO2 [2]. The memory cell block 502 does not perform switching to a redundancy memory cell 118 in correspondence with the specification information FO2 [0] to FO2 [2] of "000", similarly to the memory cell block 201 of FIG. 2.

In the flip-flop group 613, the 3-bit specification information FO3 [0] to FO3 [2] being part of the specification information IN is set. The memory cell block 503 switches the defective memory cell to the redundancy memory cell in correspondence with the specification information FO3 [0] to FO3 [2].

Figure 8:
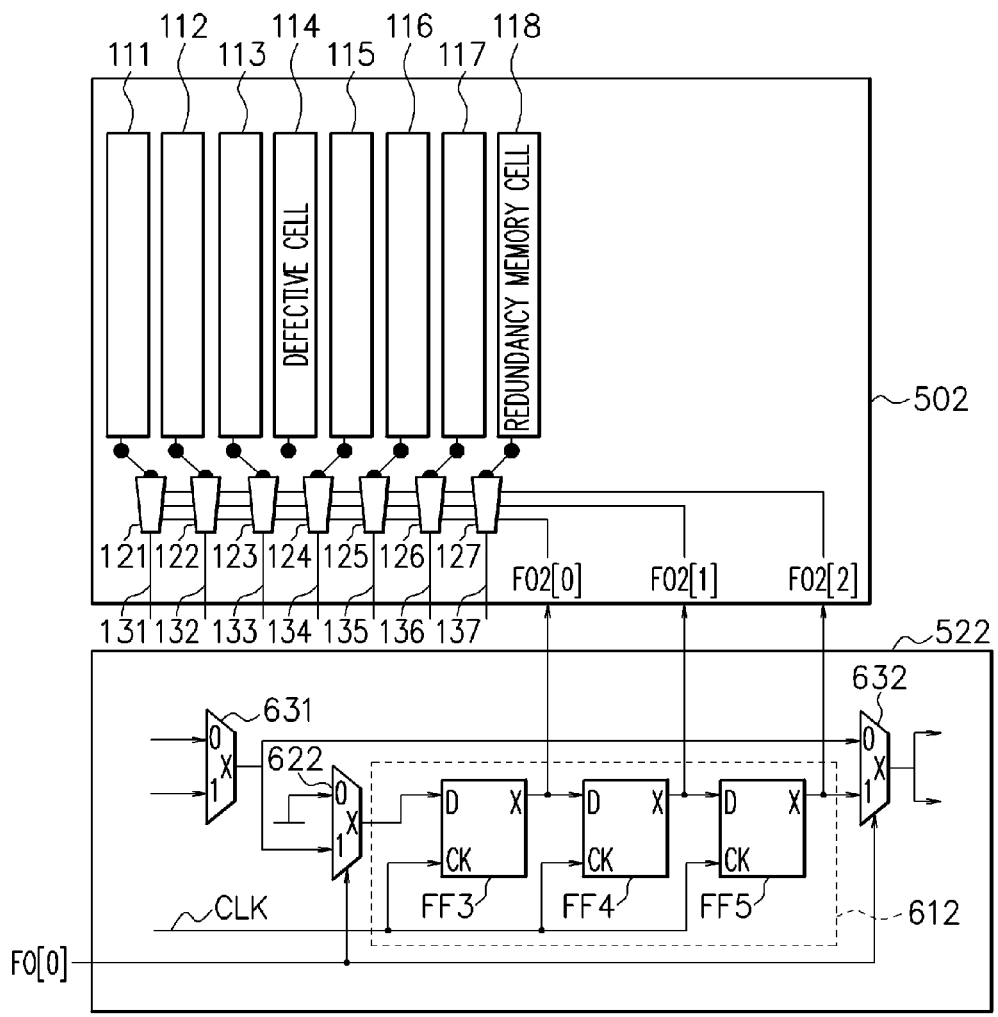
FIG. 8 is a diagram depicting a configuration example of a memory cell block and a flip-flop group.

FIG. 8 is a diagram depicting a configuration example of the memory cell block 502 and the flip-flop group 612. The memory cell blocks 501 and 503 to 50*t* also have configurations similar to a configuration of the memory cell block 502, and the flip-flop groups 611 and 613 also have configurations similar to a configuration of the flip-flop group 612.

The flip-flop group 612 has, for example, a series connection circuit of three flip-flops FF3 to FF5. The flip-flop FF3 inputs output data of the selector 622 to an input terminal D and inputs a clock signal CLK to a clock terminal CK. The flip-flop FF4 inputs output data of the flip-flop FF3 to an input terminal D, and inputs a clock signal CLK to a clock terminal CK. The flip-flop FF5 inputs output data of the FF4 to an input terminal D, inputs a clock signal CLK to a clock terminal CK, and outputs output data from an output terminal X to the selector 632. After data shift by the clock signal CLK, an output terminal X of the flip-flop FF3 outputs the specification information FO2 [0], an output terminal X of the flip-flop FF4 outputs the specification information FO2 [1], and an output terminal X of the flip-flop FF5 outputs the specification information FO2 [2].

The memory cell block 502 has a plurality of memory cells 111 to 117, a redundancy memory cell 118, and a plurality of selectors 121 to 127. The memory cells 111 to 118 are, for example, SRAM memory cells. The selectors 121 to 127 can switch, if there is a defective memory cell 114 among the plural memory cells 111 to 117, the defective memory cell 114 to the redundancy memory cell 118, in correspondence with the specification information (control signals) FO2 [0] to FO2 [2].

The specification information FO2 [0] to FO2 [2] indicate information for specifying a position of one defective memory cell among the memory cells 111 to 117 if the defective memory cell exists among the memory cells 111 to 117, and indicate data "000" telling nonexistence of a defective memory cell if the defective memory cell does not exist among the memory cells 111 to 117. The selectors 121 to 127 connect, excluding the defective memory cell 114 indicated by the specification information FO2 [0] to FO2 [2], the other memory cells 111 to 113, 115 to 118 to external lines 131 to 137. For example, the selectors 121 to 123 connect the memory cells 111 to 113 to the external lines 131 to 133 while the selectors 124 to 127 connect the memory cells 115 to 118 to the external lines 134 to 137. When the specification information F0 [2:0] indicates data "000" telling nonexistence of a defective memory cell, the selectors 121 to 127 connect the memory cells 111 to 117 to the external lines 131 to 137 respectively, similarly to in the memory cell block 201 of FIG. 2. The external lines 131 to 137 are bit lines and/or word lines. Thereby, it is possible to switch the defective memory cell 114 to the redundancy memory cell 118, which is then used.

Figure 10:
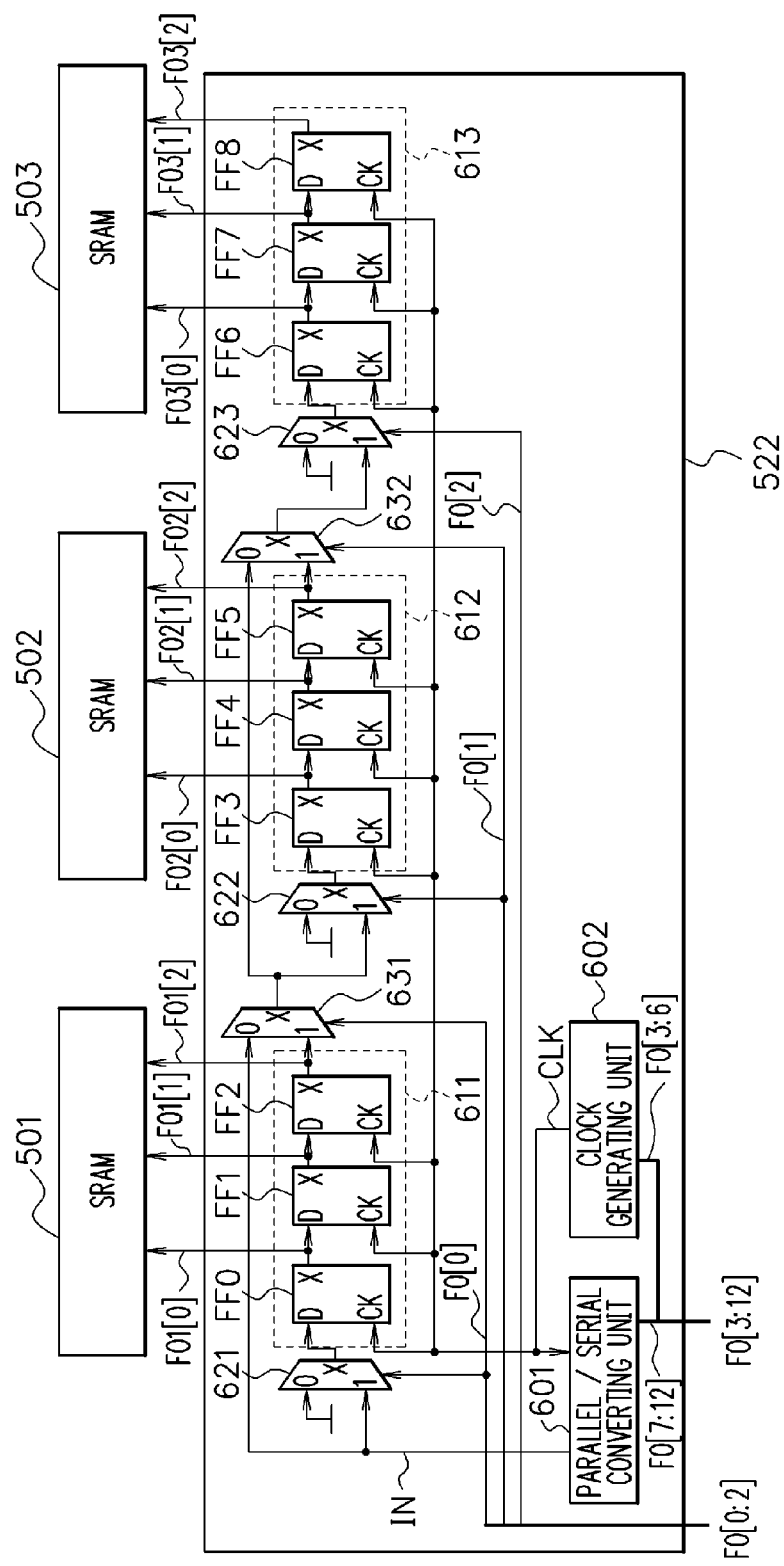
FIG. 10 is a diagram depicting a configuration example of a memory device having three memory cell blocks.

FIG. 10 is a diagram depicting a configuration example of a memory device having three memory cell blocks 501 to 503. Hereinafter, points in which FIG. 10 is different from FIG. 6 will be described. A flip-flop group 611 has a series connection circuit of three flip-flops FF0 to FF2. A flip-flop group 612 has a series connection circuit of three flip-flops FF3 to FF5. A flip-flop group 613 has a series connection circuit of three flip-flops FF6 to FF8. The flip-flops FF0 to FF2 output specification information (control signals) FO1 [0] to FO1 [2] to selectors 121 to 127 in the memory cell block 501, respectively. The flip-flops FF3 to FF5 output specification information (control signals) FO2 [0] to FO2 [2] to selectors 121 to 127 in the memory cell block 502, respectively. The flip-flops FF6 to FF8 output specification information (control signal) FO3 [0] to FO3 [2] to selectors 121 to 127 in the memory cell block 503, respectively.

Figure 9:
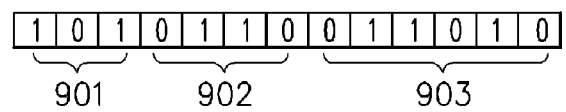
FIG. 9 is a diagram depicting an example of information stored in a fuse ROM of FIG. 5.

FIG. 9 is a diagram depicting an example of 13-bit information F0 [0:12] stored in the fuse ROM 523 of FIG. 5. The information F0 [0:12] has defect information 901, a clock pulse number 902, and specification information 903. The defect information 901 is 3-bit information F0 [0:2] indicating whether or not each of the plural memory cell blocks 501 to 503 has a defective memory cell. The clock pulse number 902 is 4-bit information F0 [3:6] indicating a clock pulse number. The specification information 903 is 6-bit information F0 [7:12] for specifying a defective memory cell in a memory cell block having the defective memory cell.

Explanation will be done in an example of a case that memory cell blocks 501 and 503 have defective memory cells and a memory cell block 502 does not have a defective memory cell. First, 3-bit F0 [0] to F0 [2] of the defect information 901 will be described. The defect information F0 [0] becomes "1" since the memory cell block 501 has the defective memory cell. The defect information F0 [1] becomes "0" since the memory cell block 502 does not have a defective memory cell. The defect information F0 [2] becomes "1" since the memory cell block 503 has the defective memory cell.

Next, 4-bit F0 [3:6] of the clock pulse number 902 will be described. The clock pulse number F0 [3:6] is represented by binary data "0110" from (number of memory cell blocks having defective memory cell)×(number of flip-flops in 10 flip-flop groups)=2×3=6.

Next, 6-bit F0 [7:12] of the specification information 903 will be described. The specification information F0 [7:12] is information for specifying the defective memory cells in the memory cell blocks 501 and 503 having the defective memory cells. For example, the specification information F0 [7:12] is represented by "011011". Here, the 3-bit specification information F0 [7] to F0 [9] is "011" and the specification information FO3 [0] to FO3 [2] for specifying the defective memory cell in the memory cell block 503. Further, the 3-bit specification information F0 [10] to F0 [12] is "010", and is specification information FO1 [0] to FO1 [2] for specifying the defective memory cell in the memory cell block 501.

FIG. 11 is a timing chart indicating an operation example of the memory device of FIG. 10 when the information F0 [0:12] of FIG. 9 is inputted. A high level of a signal indicates "1" while a low level of a signal indicates "0". Since the defect information F0 [0] is "1", the selector 621 selects and outputs 1-bit F0 [7]="0" of the specification information IN, and the selector 631 selects and outputs output data of the flip-flop FF2. Further, since the defect information F0 [1] is "0", the selector 622 selects and outputs data "0" and the selectors 632 selects and outputs output data of the selector 631. Further, since the defect information F0 [2] is "1", the selector 623 selects and outputs output data of the selector 632.

First, by a first pulse of a clock signal CLK, the flip-flop FF0 outputs specification information F0 [7]="0" as the specification information FO1 [0]. Further, the flip-flop FF3 outputs data "0" as the specification information FO2 [0].

Next, by a second pulse of the clock signal CLK, the flip-flop FF0 outputs specification information F0 [8]="1" as the specification information FO1 [0], and the flip-flop FF1 outputs specification information F0 [7]="0" as the specification information FO1 [1]. Further, the flip-flop FF3 outputs data "0" as the specification information FO2 [0], and the flip-flop FF4 outputs data "0" as the specification information FO2 [1].

Next, by a third pulse of the clock signal CLK, the flip-flop FF0 outputs specification information F0 [9]="1" as the specification information FO1 [0], the flip-flop FF1 outputs specification information F0 [8]="1" as the specification information FO1 [1], and the flip-flop FF2 outputs specification information F0 [7]="0" as the specification information FO1 [2]. Further, the flip-flop FF3 outputs data "0" as the specification information FO2 [0], the flip-flop FF4 outputs data "0" as the specification information FO2 [0], and the flip-flop FF5 outputs data "0" as the specification information FO2 [2].

Next, by a fourth pulse of the clock signal CLK, the flip-flop FF0 outputs specification information F0 [10]="0" as the specification information FO1 [0], the flip-flop FF1 outputs specification information F0 [9]="1" as the specification information FO1 [1], and the flip-flop FF2 outputs specification information F0 [8]="1" as the specification information FO1 [2]. Further, the flip-flop FF6 outputs specification information F0 [7]="0" as the specification information FO3 [0]. Further, the flip-flop FF3 outputs data "0" as the specification information FO2 [0], the flip-flop FF4 outputs data "0" as the specification information FO2 [1], and the flip-flop FF5 outputs data "0" as the specification information FO2 [2].

Next, by a fifth pulse of the clock signal CLK, the flip-flop FF0 outputs specification information F0 [11]="1" as the specification information FO1 [0], the flip-flop FF1 outputs specification information F0 [10]="0" as the specification information FO1 [1], and the flip-flop FF2 outputs specification information F0 [9]="1" as the specification information FO1 [2]. Further, the flip-flop FF6 outputs specification information F0 [8]="1" as the specification information FO3 [0], and the flip-flop FF7 outputs specification information F0 [7]="0" as the specification information FO3 [1]. Further, the flip-flop FF3 outputs data "0" as the specification information FO2 [0], the flip-flop FF4 outputs data "0" as the specification information FO2 [1], and the flip-flop FF5 outputs data "0" as the specification information FO2 [2].

Next, by a sixth pulse of the clock signal CLK, the flip-flop FF0 outputs specification information F0 [12]="0" as the specification information FO1 [0], the flip-flop FF1 outputs specification information F0 [11]="1" as the specification information FO1 [1], the flip-flop FF2 outputs specification information F0 [10]="0" as the specification information FO1 [2]. Further, the flip-flop FF6 outputs specification information F0 [9]="1" as the specification information FO3 [0], the flip-flop FF7 outputs specification information F0 [8]="1" as the specification information FO3 [1], and the flip-flop FF8 outputs specification information F0 [7]="0" as the specification information FO3 [2]. Further, the flip-flop FF3 outputs data "0" as the specification information FO2 [0], the flip-flop FF4 outputs data "0" as the specification information FO2 [1], and the flip-flop FF5 outputs data "0" as the specification information FO2 [2].

By the above operation, the specification information FO3 [0] to FO3 [2] becomes "011" and is outputted to the selectors 121 to 127 in the memory cell block 503. Further, the specification information FO2 [0] to FO2 [2] becomes "000" and is outputted to the selectors 121 to 127 in the memory cell block 502. Further, the specification information FO1 [0] to FO1 [2] becomes "010" and is outputted to the selectors 121 to 127 in the memory cell block 501.

By six pulses of the clock signal CLK, the specification information F0 [7] to F0 [12]="011010" are shifted serially and set in the flip-flops FF0 to FF2 and FF6 to FF8 corresponding to the memory cell blocks 501 and 503 having defective memory cells. The flip-flops FF0 to FF2 output specification information F0 [10] to F0 [12]="010" as the specification information FO1 [0] to FO1 [2]. Further, the flip-flops FF6 to FF8 output specification information F0 [7] to F0 [9]="011" as the specification information FO3 [0] to FO3 [2].

According to the present embodiment, it suffices to make the fuse ROM 523 store the specification information F0 [7] to F0 [12] of the memory cell blocks 501 and 503 having the defective memory cells, excluding the specification information FO2 [0] to FO2 [2]="000" of the memory cell block 502 not having a defective memory cell, and thus it is possible to make a storage capacity of the fuse ROM 523 small thereby to make an area of a semiconductor chip of a memory device small.

The flip-flops FF0 to FF8 are provided in correspondence with respective bit lines of the specification information (control signal) FO1 [0] to FO1 [2], FO2 [0] to FO2 [2], and FO3 [0] to FO3 [2] of the selectors 121 to 127 of the plural memory cell blocks 501 to 503, synchronized with the clock signal CLK, and shift the specification information F0 [7:12] serially. The selectors 621 to 623, 631 and 632 are bypath circuits which bypath the flip-flops FF3 to FF5 corresponding to the memory cell block 502 which corresponds to defect information F0 [1] if the defect information F0 [1] is information not having a defective memory cell, and which shift specification information F0 [7:12] serially in relation to the flip-flops FF0 to FF2 and FF6 to FF8 corresponding to the memory cell blocks 501 and 503 which corresponds to defect information F0 [0] and F0 [2] if the defect information F0 [0] and F0 [2] are information indicating having defective memory cells. The selectors 621 to 623 are reset circuits making the flip-flops FF3 to FF5 corresponding to the memory cell block 502 which corresponds to defect information F0 [1] store data (control signal) of "0" indicating nonexistence of a defective memory cell if the defect information F0 [1] is information not having the defective memory cell. The clock generating unit 602 outputs a clock signal CLK for making the flip-flops FF0 to FF8 shift the specification information f0 [7:12] to the plural flip-flops FF0 to FF8. The flip-flops FF0 to FF8, after being synchronized with the clock signal CLK to shift the specification information F0 [7:12], output specification information (control signal) FO1 [0] to FO1 [2], FO2 [0] to FO2 [2], FO3 [0] to FO3 [2] of the selectors 121 to 127 of the plural memory cell blocks 501 to 503. The selectors 121 to 127 of the memory cell blocks 501 to 503 switch the defective memory cell to the redundancy memory cell in correspondence with the specification information (control signal) FO1 [0] to FO1 [2], FO2 [0] to FO2 [2], and FO3 [0] to FO3 [2].

According to the present embodiment, the defective memory cell is switched to the redundancy memory cell based on the defect information F0 [0:2], the clock pulse number F0 [3:6], and the specification information F0 [7:12], it is possible to switch a defective memory cell to a redundancy memory cell with a small amount of information.

Figure 12:
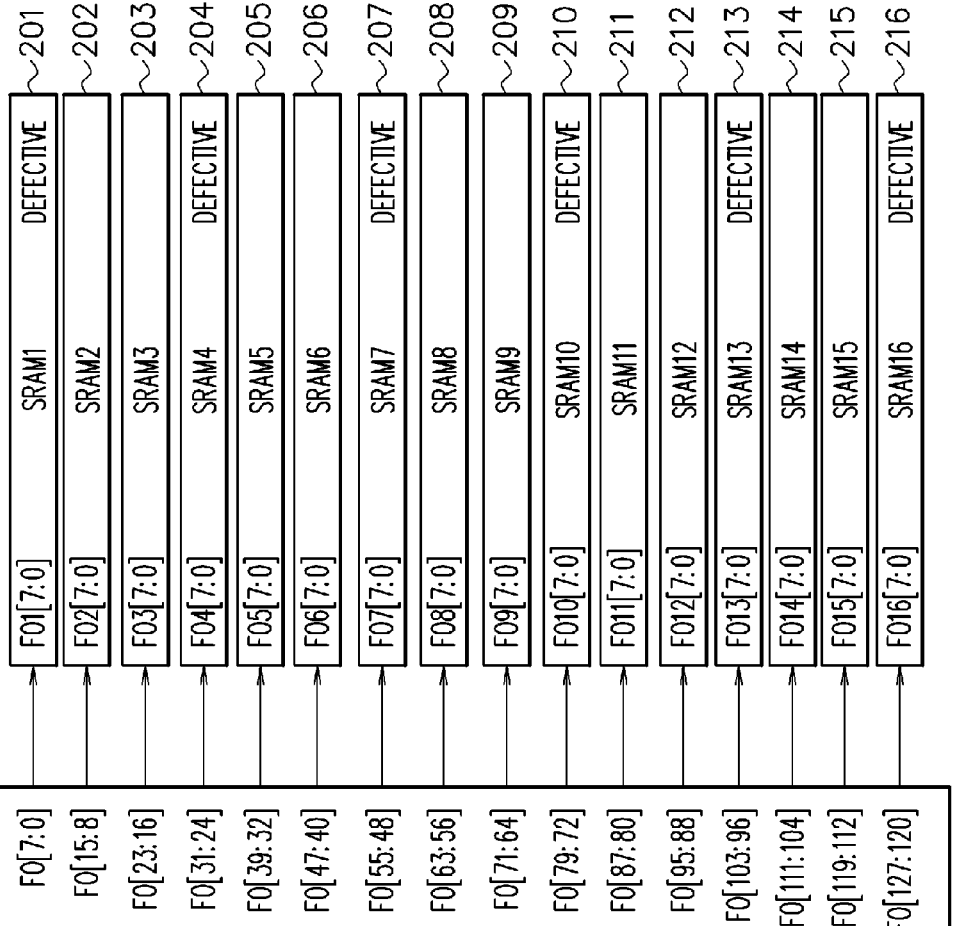
FIG. 12 is a diagram for explaining a storage capacity of a fuse ROM necessary for the memory devices of FIG. 1 to FIG. 3.

FIG. 12 is a diagram for explaining a storage capacity of a fuse ROM 103 necessary for the memory device of FIG. 1 to FIG. 3. For example, the memory device has sixteen memory cell blocks 201 to 216. Explanation will be done in an example of a case that, for example, the six memory blocks 201, 204, 207, 210, 213, 216 among the sixteen memory cell blocks 201 to 216 have defective memory cells. In this case, since ten memory cell blocks among the sixteen memory blocks 201 to 216 are non-defective, a manufacturing yield is 10÷16=62.5%. The sixteen memory cell blocks 201 to 216 input 8-bit specification information FO1 [7:0] to FO16 [7:0], respectively. Therefore, information to be stored in the fuse ROM 103 is 8 bits×16=128 bits. In order to make the fuse ROM 103 store 128-bit information F0 [127:0], the storage capacity of the fuse ROM 103 is necessary to be 128 bits.

FIG. 13 is a diagram for explaining a storage capacity of the fuse ROM 523 necessary for the memory device of FIG. 5 of the present embodiment. Similarly to in FIG. 12, the memory device has sixteen memory cell blocks 501 to 516. Explanation will be done in an example of a case that, for example, six memory cell blocks 501, 504, 507, 510, 513, 516 among the sixteen memory cell blocks 501 to 516 have defective memory cells. In this case, since ten memory cell blocks among the sixteen memory cell blocks 501 to 516 are non-defective, a manufacturing yield is 10÷16=62.5%.

First, since the defect information 901 is information indicating whether or not the sixteen memory cell blocks 501 to 516 each have a defective memory cell, the defect information 901 becomes 16-bit.

Next, a clock pulse number 902 will be described. Since each of the six defective memory cell blocks 501, 504, 507, 510, 513, 516 inputs 8-bit specification information FO1 [7:0], FO4 [7:0], FO7 [7:0], FO10 [7:0], FO13 [7:0], FO16 [7:0], 6×8 bits=48 pulses are necessary. Accordingly, the clock pulse number 902 is necessary to have 6 bits in order to express a clock pulse number of "48" by a binary number.

Next, specification information 903 will be described. Since each of the six defective memory cell blocks 501, 504, 507, 510, 513, 516 inputs 8-bit specification information FO1 [7:0], FO4 [7:0], FO7 [7:0], FO10 [7:0], FO13 [7:0], FO16 [7:0], 6×8 bits=48 bits are necessary. Accordingly, the specification information 903 is 48-bit.

Since information to be stored in the fuse ROM 523 has a total bit number of the defect information 901, the clock pulse number 902, and the specification information 903, the information to be stored in the fuse ROM 523 is of 16+6+48=70 bits. In order to store the 70-bit information F0 [69:0] in the fuse ROM 523, a storage capacity of the fuse ROM 523 is necessary to be 70 bits.

Accordingly, the storage capacity (70 bits) of the fuse ROM 523 of the memory device of the present embodiment can be made smaller than that of the storage capacity (128 bits) of the fuse ROM 103 of the memory device of FIG. 1 to FIG. 3. In contrast, if the storage capacity of the fuse ROM 103 of the memory device of FIG. 1 to FIG. 3 is 70 bits, it becomes impossible to rescue defective memory cells of the memory cell block 210 and the following memory cell blocks.

It should be noted that the memory device of the present embodiment can be applied not only to a memory device having an SRAM but also to a memory device having other redundancy memory cells such as a DRAM.

Since a defective memory cell is switched to a redundancy memory cell based on defect information and specification information, it is possible to switch the defective memory cell to the redundancy memory cell by small amount of information.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A memory device comprising:
   a plurality of memory cell blocks, the memory cell blocks include a plurality of memory cells, a redundancy memory cell, and a selector switching a defective memory cell among the plurality of memory cells to the redundancy memory cell; and
   a control circuit configured to output control signals of the selectors of the plurality of memory cell blocks, based on defect information of whether or not each of the plurality of memory cell blocks has a defective memory cell and on specification information for specifying the defective memory cell in the memory cell block having the defective memory cell,
   wherein the control circuit has:
   a plurality of flip-flops provided in correspondence with respective bit lines of the control signals of the selectors of the plurality of memory cell blocks and configured to shift the specification information serially;
   a bypath circuit configured to bypath the flip-flop corresponding to the memory cell block which corresponds to the defect information if the defect information is information of not having the defective memory cell, and configured to shift the specification information serially in relation to the flip-flop corresponding to the memory cell block which corresponds to the defect information if the defect information is information of having the defective memory cell;

a reset circuit configured to make the flip-flop corresponding to the memory cell block which corresponds to the defect information store the control signal indicating nonexistence of the defective memory cell, if the defect information is information of not having the defective memory cell; and a clock generating unit configured to output a clock signal to make the plurality of flip-flops shift the specification information to the plurality of flip-flops, wherein the plurality of flip-flops, after being synchronized with the clock signal and shifting the specification information, outputs the control signals of the selectors of the plurality of memory cell blocks, and wherein the selector of the memory cell block switches the defective memory cell to the redundancy memory cell in correspondence with the control signal.

2. The memory device according to claim 1, wherein the control circuit has a nonvolatile memory storing the defect information and the specification information.

3. The memory device according to claim 2, wherein the nonvolatile memory further stores a pulse number of the clock signal, and wherein the clock generating unit generates a clock signal having the pulse number in the nonvolatile memory.

4. The memory device according to claim 2, wherein the control circuit includes a parallel and serial converting unit converting the specification information in the nonvolatile memory from parallel to serial, and wherein the plurality of flip-flops input the serial specification information.

\* \* \* \* \*